(12) United States Patent
Simmons et al.

(10) Patent No.: US 12,301,224 B2
(45) Date of Patent: May 13, 2025

(54) METHODS FOR QUBIT READOUT

(71) Applicant: Silicon Quantum Computing Pty Limited, Kensington (AU)

(72) Inventors: Michelle Yvonne Simmons, New South Wales (AU); Samuel Keith Gorman, New South Wales (AU); Rajib Rahman, New South Wales (AU); Edyta Natalia Osika, New South Wales (AU)

(73) Assignee: Silicon Quantum Computing Pty Limited, Kensington (AU)

( * ) Notice: Subject to any disclaimer, the term of this patent is extended or adjusted under 35 U.S.C. 154(b) by 15 days.

(21) Appl. No.: 18/178,272

(22) Filed: Mar. 3, 2023

(65) Prior Publication Data

US 2023/0283280 A1  Sep. 7, 2023

(30) Foreign Application Priority Data

Mar. 3, 2022 (AU) .................. 2022900513

(51) Int. Cl.
*H03K 17/92* (2006.01)
*G06N 10/20* (2022.01)
*G06N 10/40* (2022.01)
*H10N 60/10* (2023.01)

(52) U.S. Cl.
CPC ............. *H03K 17/92* (2013.01); *G06N 10/20* (2022.01); *G06N 10/40* (2022.01); *H10N 60/11* (2023.02); *H10N 60/128* (2023.02)

(58) Field of Classification Search
CPC ........ H03K 17/92; G06N 10/20; G06N 10/40; G06N 10/00; H10N 60/11; H10N 60/128; H01L 29/127
USPC ...................... 326/1; 257/34, 9, 13; 977/933
See application file for complete search history.

(56) References Cited

U.S. PATENT DOCUMENTS

2006/0260016 A1  11/2006  Greentree et al.

OTHER PUBLICATIONS

Research Article | Jan. 1, 1969 Dielectric Materials in Semiconductor Devices, T.L. Chu J. Vac. Sci. Technol. 6, 25-33 (1969) (Year: 1969).*
Radio frequency measurements of tunnel couplings and singlet-triplet spin states in Si:P quantum dots M.G. House1 , T. Kobayashi1 | Accepted Oct. 8, 2015 | Published Nov. 9, 2015 (Year: 2015).*
European Search Report from the European Patent Office for Application 23159904.4, mailed on Jun. 26, 2023, a counterpart foreign application of U.S. Appl. No. 18/178,272, 8 pgs.
Orona, et al., "Readout of Singlet-Triplet Qubits at Large Magnetic Field Gradients," Physical Review B, vol. 98, No. 12, 2018, 8 pgs.

* cited by examiner

*Primary Examiner* — Arnold M Kinkead
(74) *Attorney, Agent, or Firm* — Lee & Hayes, P.C.

(57) ABSTRACT

A method for readout of a singlet-triplet qubit in a donor based quantum processing element is disclosed. The method includes: initialising the singlet-triplet qubit in a ground state $|G\rangle$; performing a shelving readout; using a final measured charge configuration of the singlet-triplet qubit to determine information about a current Zeeman energy difference; and using the information about the current Zeeman energy difference to adjust mapping of the shelving readout.

13 Claims, 6 Drawing Sheets

(1)

METHODS FOR QUBIT READOUT

CROSS REFERENCE

This application claims priority to Australian Provisional Patent application AU2022900513, filed on 3 Mar. 2022 and titled, 'Methods for qubit readout', the entire content of which is incorporated herein in its entirety.

TECHNICAL FIELD

Aspects of the present disclosure are related to advanced processing systems and in particular to methods for readout in advanced processing systems.

BACKGROUND

The developments described in this section are known to the inventors. However, unless otherwise indicated, it should not be assumed that any of the developments described in this section qualify as prior art merely by virtue of their inclusion in this section, or that those developments are known to a person of ordinary skill in the art.

Large-scale quantum processing systems hold the promise of a technological revolution, with the prospect of solving problems which are out of reach with classical machines. To date, a number of different structures, materials, and architectures have been proposed to implement quantum processing systems and to fabricate their basic information units (quantum bits or qubits). Qubits may be understood as a two-level quantum system, where non-degenerate spin states represent the two levels.

Qubit readout—i.e., determining or measuring the state or encoded information in a qubit—is a fundamental quantum operation in quantum computing. To yield reliable readout results, it is important to measure qubit states with reasonable fidelities (usually above 99% fidelity) and to perform the readout at a speed that is faster than the spin relaxation time of the qubit. Although there are several current readout techniques, they are often prone to errors and may not yield reliable results.

Accordingly, improved techniques for measuring qubit states in quantum processing systems are desirable.

SUMMARY

According to an aspect of the present disclosure there is provided a method for readout of a singlet-triplet qubit in a donor based quantum processing element, the method comprising the steps of: initialising the singlet-triplet qubit in a ground state $|G\rangle$; performing a shelving readout; using a final measured charge configuration of the singlet-triplet qubit to determine information about a current Zeeman energy difference; and using the information about the current Zeeman energy difference to adjust mapping of the shelving readout.

In one example, the determined information about the current Zeeman energy difference is the sign of the Zeeman energy difference, i.e., whether it is negative or positive.

The method of the first aspect further comprising performing a qubit operation.

In some embodiments, the donor based quantum processing element comprises: a semiconductor substrate, a dielectric material forming an interface with the semiconductor substrate, one or more gate electrodes, and a double dot system comprising two dopant dots embedded in the semiconductor substrate, each dopant dot comprising one or more dopant atoms and two or more electrons or holes confined in the double dot system.

In some examples, the two or more electrons are loaded on to the donor dots via at least one gate electrode of the one or more gate electrodes.

Further, in some embodiments, the donor atoms are phosphorus atoms.

In an example, the semiconductor substrate is silicon and the dielectric is silicon dioxide. Preferably, the semiconductor substrate is isotopically purified silicon-28 and the dielectric is silicon dioxide.

Further still, the gate of the one or more gate electrodes may be manufactured within the semiconductor substrate to control the donor dots.

In some embodiments, the spin of the two or more electrons are entangled to form a singlet state and three triplet states. Further, the singlet-triplet qubit may be encoded in the $|S\rangle$ singlet state and a $|T_0\rangle$ triplet state.

In some embodiments, performing the shelving readout comprises: starting the singlet-triplet qubit in a (1,1) charge configuration, moving the singlet-triplet qubit from the (1, 1) charge configuration to a (1,2) charge configuration by applying potentials to the one or more gate electrodes; moving the singlet-triplet qubit back to the (1,1) charge configuration by applying potentials to the one or more gate electrodes; and adiabatically changing $\epsilon$ to move the singlet-triplet qubit to a (0,2) charge configuration.

BRIEF DESCRIPTION OF DRAWINGS

While the invention is amenable to various modifications and alternative forms, specific embodiments are shown by way of example in the drawings and are described in detail. It should be understood, however, that the drawings and detailed description are not intended to limit the invention to the particular form disclosed. The intention is to cover all modifications, equivalents, and alternatives falling within the spirit and scope of the present invention as defined by the appended claims.

DETAILED DESCRIPTION

As described above, it is important to establish reliable readout method for reading out the state of a singlet-triplet qubit.

Overview

Generally speaking, quantum computers provide means to solve certain computing problems that cannot be solved in a reasonable period of time using conventional, classical computers. These problems include factoring very large numbers into their primes (which on a quantum computer can be accomplished relatively quickly using Shor's algorithm), and searching large, unstructured data sets (which can be done on a quantum computer using Grover's search algorithm). These algorithms are well-understood in terms of operations that need to be performed over a few qubits.

As described previously, a number of different techniques exist to fabricate the basic information units (quantum bits or qubits) of quantum processing systems or quantum computers. One way of fabricating qubits, for example, is to use the nuclear or the electron spin of phosphorus donor atoms in silicon such that the nuclear/electron spin of each phosphorus donor atom acts as a qubit. Spin qubits based on phosphorus donors in silicon have demonstrated excellent coherence and relaxation times. These long coherence times, together with the mature fabrication technology based on scanning tunnelling microscopy, makes silicon-phosphorus systems a promising semiconductor platform for quantum information processing.

While implementation and operation of single electron qubits in Si:P using magnetic means is well established, there is still high interest in alternative qubit systems which can be controlled purely by electrical means, which can simplify the task of scaling up quantum computers.

One such electrically controllable processing element is a singlet-triplet qubit. The use of electrical control in these qubits simplifies the task of scaling up to a large-scale quantum computer as there is no need for micro-magnets to be included on the chip for magnetic addressability in such qubits. In singlet-triplet qubits, two electrostatically-defined or donor-based quantum dots, occupied by two or more electrons, are formed side-by-side and tuned so that they can be tunnel coupled. Information can be stored in the relative spin and spatial symmetry states of the two electrons, further reducing coupling of the qubit to its environment. Singlet-triplet qubits of this type typically include two electrons localized within a double quantum dot (QD) and coupled by the exchange interaction between them.

Figure 1A:
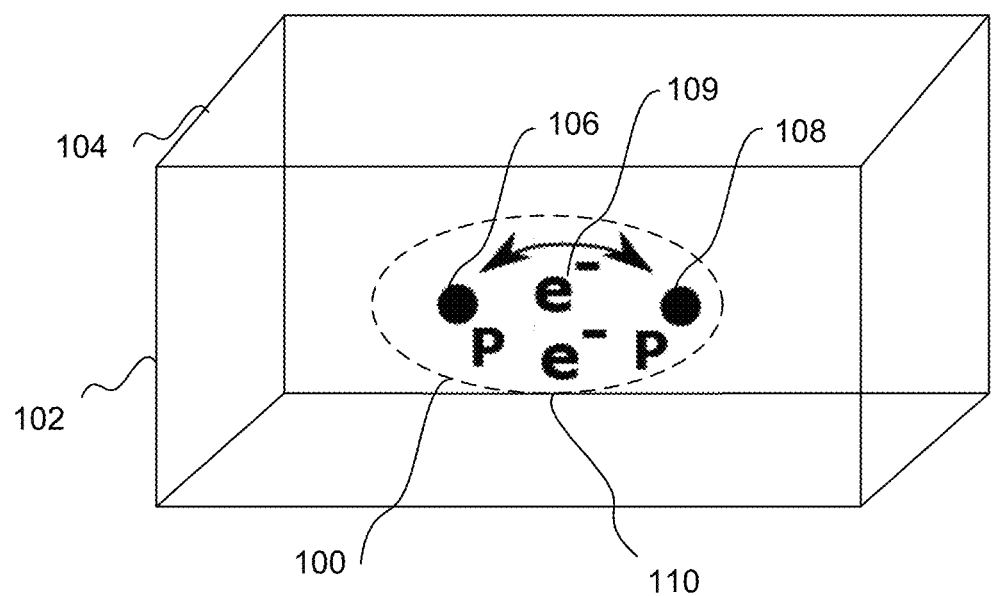
FIG. 1A shows a schematic of an example singlet-triplet qubit in a donor quantum processing system.

FIG. 1A shows a schematic of an example singlet-triplet qubit 100 in a donor system. In this example, the qubit 100 is located in a semiconductor substrate 102 having a surface 104. In this example, the semiconductor substrate is $^{28}$silicon. A dielectric, such as silicon dioxide, may be fabricated above the surface 104.

The qubit 100 includes a pair of tunnel-coupled donor atom clusters 106, 108 and two electrons 109 and 110 bound to the pair of donor atom clusters 106, 108. There may be additional electrons in the qubit 100. In certain embodiments, the donor atom clusters 106, 108 are placed in the silicon substrate 102 with atomic-scale precision using scanning tunneling lithography techniques.

Figure 1B:
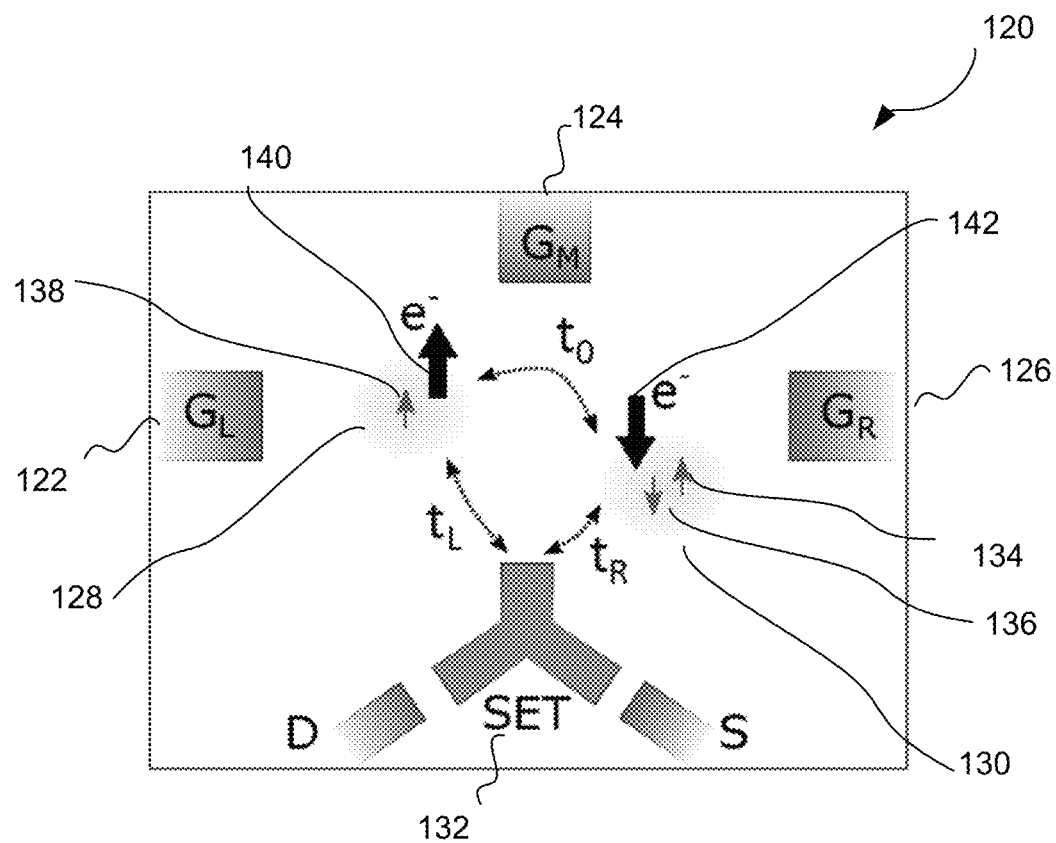
FIG. 1B shows a schematic quantum processing system of two donor quantum dots according to aspects of the present disclosure.

FIG. 1B shows another top view schematic of a two donor quantum dots (singlet-triplet qubit) system 120 according to aspects of the present disclosure. In this example, there are three gates 122, 124, 126. There are two quantum dots (donor dots) 128, 130 each tunnel-coupled to a single electron transistor (SET) 132. In this example, the double quantum dot system 100 is a 1P-2P system, with three nuclear spins 134, 136, 138 shown by the small arrows. There are two electrons and thus two electron spins 140, 142 in the system shown by the large arrows. The gates and/or SET may be fabricated on top of the dielectric or within the silicon substrate 102. In some examples, the gates and/or SET may be fabricated in-plane with the double-donor quantum dots.

The left and right quantum dots 128, 130 can each tunnel to the SET 132 via $t_L$ and $t_R$ respectively. The two quantum dots 128, 130 are also tunnel coupled via $t_0$ allowing the electrons 140, 142 to form singlet and triplet states across both quantum dots. In general each dot 128, 130 can be occupied by an odd number of electrons. In such cases, only the behaviours of one unpaired, highest energy electron in each dot contributes to the singlet-triplet qubit formation. The SET 132 serves as an electron reservoir for the donor dots 128, 130 and is used as a charge sensor. The surrounding gates 122, 124, 126 control the electrostatic environment of the dots.

In certain embodiments, each donor cluster 106, 108 may have a single donor atom and the donor atom may be a phosphorous (P) atom such that the qubit 100 is a 1P-1P system. In other embodiments, the qubit 100 may be an nP-mP system and the donor atom clusters 106, 108 may have any other number of phosphorous donor atoms, where n=m or n≠m.

For a two-electron qubit 100 there are four possible combined spin states. Each electron has two possible spin states, spin-down and spin-up, denoted $|\downarrow\rangle$ and $|\uparrow\rangle$, respectively. Combining the two spin states of each electron yields four new states. There is one singlet state with total spin angular momentum 0. This state is:

$$|S\rangle = \frac{1}{\sqrt{2}}(|\uparrow\downarrow\rangle - |\downarrow\uparrow\rangle)$$

Where the first arrow and second arrow in each combination indicate the spin direction of the first and second electron respectively. There are three triplet states, each with total spin angular momentum 1:

$$|T_+\rangle = |\uparrow\uparrow\rangle$$

$$|T_0\rangle = \frac{1}{\sqrt{2}}(|\uparrow\downarrow\rangle + |\downarrow\uparrow\rangle)$$

$$|T_-\rangle = |\downarrow\downarrow\rangle.$$

Here, the $T_+$ triplet states corresponds to both electrons being in the spin-up state.

Of the four possible relative spin states of the electrons (S, $T_0$, $T_+$, $T_-$), information is generally stored in the S (singlet state) and $T_0$ (a triplet state) states (the so-called 'logical subspace'). This choice is generally motivated by two advantages. First, the two qubit states remain unaffected by changes in magnetic field (with magnetic quantum number, m=0), which further decouples them from the environment.

Second, due to the Pauli Exclusion principle, in the singlet state, one electron has an orbital wavefunction hybridized between the two donors dots, and in the triplet states both electrons are confined to separate donor dots. Therefore, by tuning the relative electrochemical potentials of the two dots, the charge distribution of electrons can be tuned.

Multiple realisations of singlet-triplet qubit have been implemented in double QD and quantum dot-donor systems. Crucially, for large-scale implementations, singlet-triplet qubits 100 can be measured and/or controlled via a single gate—thereby allowing for high density scaling of the qubits. This minimal gate density allows for the qubits to be closer together and minimises the classical electronics required to operate the quantum computer.

Typically, the singlet-triplet qubits are measured using dispersive readout. Dispersive readout works by applying a radio frequency voltage signal to a nearby gate that moves the electrons between the quantum dots. The movement of the electrons creates a changing capacitance which can be detected using a resonant circuit connected to the same gate or a reservoir. This dispersive readout allows for minimal gate densities, i.e., less gates than dots, and the possibility for frequency multiplexed qubit measurements which can be useful for large quantum systems.

To realize purely electrical control of the singlet-triplet qubit, the two quantum dots 106, 108 need to be characterized by different spin Zeeman splittings, which is caused by the interaction between a magnetic field and a magnetic dipole moment. That Zeeman energy difference, $\Delta E_z$, allows coupling between the singlet and triplet states and therefore the ability to perform qubit rotations.

In electrostatically-defined quantum dots, $\Delta E_z$ can be produced by a nuclear spin bath, micro-magnets, spin-orbit interaction or difference of g-factors in two quantum dots. However, in donor-based devices the same coupling can be achieved using hyperfine interaction between electron and nuclear spins inherently present in the system. For example, each of the phosphorous donors 106 and 108 have a nuclear spin that interacts with the two electron spins. The electron-nuclear hyperfine interaction can be described as an effective magnetic field experienced by the electrons. The magnetic field can be treated as homogeneous if the hyperfine interaction is same at both dots. Alternatively, if the interaction differs between the dots then it is the magnetic field gradient that causes a difference in the Zeeman splitting, $\Delta E_z$.

Although $\Delta E_z$ is desirable as it is necessary for fast singlet-triplet qubit operation, it is also a source of triplet relaxation. That is, it provides an energy pathway for the $T_0$ triplet state to relax into another state, i.e., singlet $S(0,2)$. The fast relaxation is the most prominent in context of the singlet-triplet qubit readout, significantly limiting the visibility of the standard Pauli spin-blockade readout (PSB). Additionally, in donor-based devices, $\Delta E_z$ can change in time together with nuclear spin polarization of the donors 106 and 108, as nuclear spins can undergo uncontrolled flips. As such, these processes need to be accounted for when designing and interpreting readout outcomes for singlet-triplet qubits in donor-based devices.

One widely used singlet-triplet readout technique is called Pauli spin-blockade readout (PSBR). This method gives relatively small contrast between the singlet and triplet states since it relies on measuring the charge distribution within the double quantum dot. The PSBR method also suffers from fast triplet relaxation when singlet-triplet state mixing is present in the system.

Figure 2A:
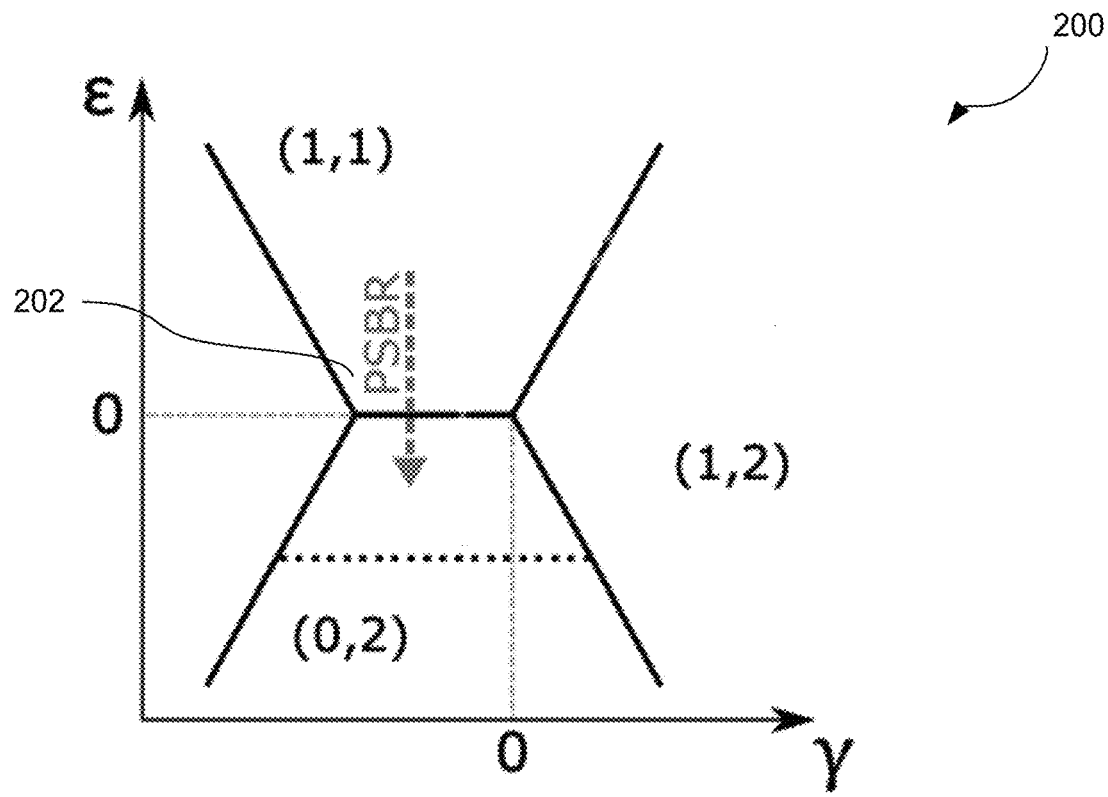
FIG. 2A is a schematic of a charge stability diagram showing a Pauli spin blockade readout process.

FIG. 2A schematically illustrates the PSBR method. In particular, it shows a charge stability diagram 200 with detuning between quantum dots, $\epsilon$, on the y-axis and the parameter $\gamma$ (indicating the potentials applied on one or more of the gate electrodes) controlling the total number of electrons in the system on the x-axis. There are three areas of the diagram—namely the charge configurations (1,1), (0,2) and (1,2). The dotted arrow 202 represents the PSBR method. The method includes changing the detuning adiabatically from the (1,1) charge configuration 202 to Pauli-blocked (0,2) charge configuration 208. Where $(n_L, n_R)$ corresponds to $n_L$ electrons in left and $n_R$ in right dot. During the transition, the singlet qubit state is mapped to (0,2) charge configuration, while for triplet $T_0$ the tunneling between the dots is blocked so $T_0$ stays in (1,1) charge configuration. For high fidelity readout the charge configurations need to be measured faster than $T_0$ to $S(0,2)$ relaxation rate, which is difficult with fast relaxation caused by magnetic field gradient.

Alternative singlet-triplet readout methods have been developed to address the shortcomings of PSBR and adjust the readout process to the needs of specific quantum dot architectures. The improved visibility of the new readout methods in comparison to PSBR is achieved via either mapping the triplet state to some metastable state which minimizes relaxation, or mapping the (1,1) and (0,2) charge configurations to states differing in total number of electrons.

Shelving Readout

One alternative readout method that may be used to overcome the limitations of PSBR is called shelving. Shelving has been demonstrated to be efficient for gate-defined quantum dot devices. In particular, the shelving readout method for donor-based devices has improved readout fidelity in comparison to the standard PSBR. Moreover, shelving is well-suited for singlet-triplet qubits subject to large magnetic field gradients, typically of the order of a few mT (ten-hundredths of MHz) of $\Delta E_z$, where $\Delta E_z$ changes in time, which is a characteristic very specific to the donor-based system (in gate-defined quantum dots, $\Delta E_z$ is either constant in time due to use of micro-magnets or the changes in $\Delta E_z$ are not widely discussed).

Shelving readout operates in the charge occupation subspace comprising the (1,1), (0,2) and (1,2) configurations. The electron distribution between the dots is controlled with detuning $\epsilon$ while loading of additional electrons from the SET 132 is determined with a parameter $\gamma$, which represents the global energy shift of both quantum dots (QDs). Both $\epsilon$ and $\gamma$ can be controlled by the leads surrounding the double-dot system. In some examples gates 122, 124, and 126 can be used to control these parameters.

Figure 2B:
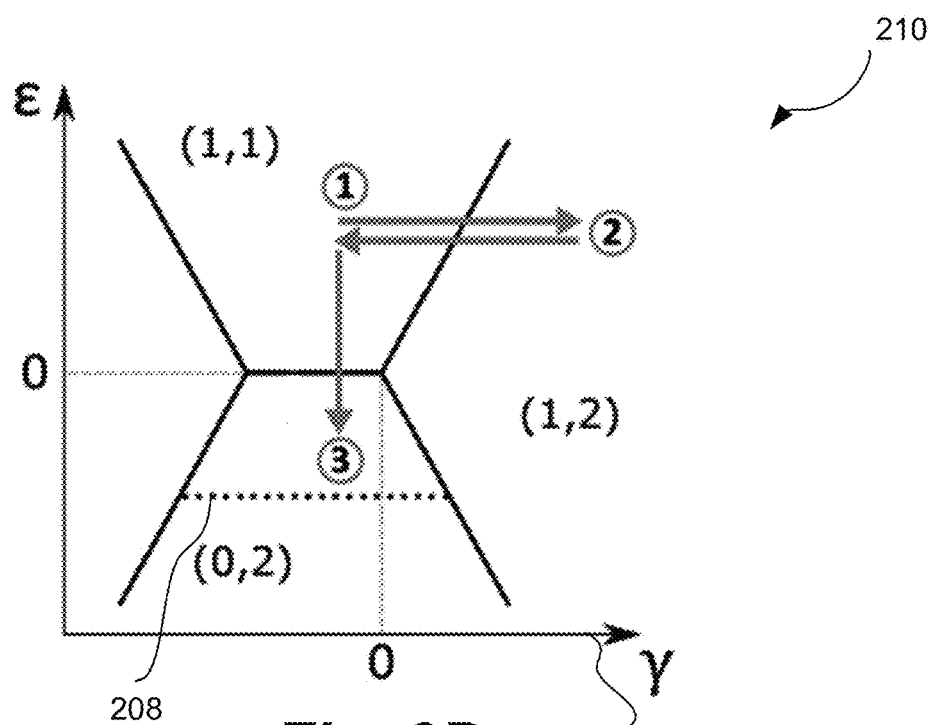
FIG. 2B is a schematic of a charge stability diagram showing a shelving readout process.
Figure 2C:
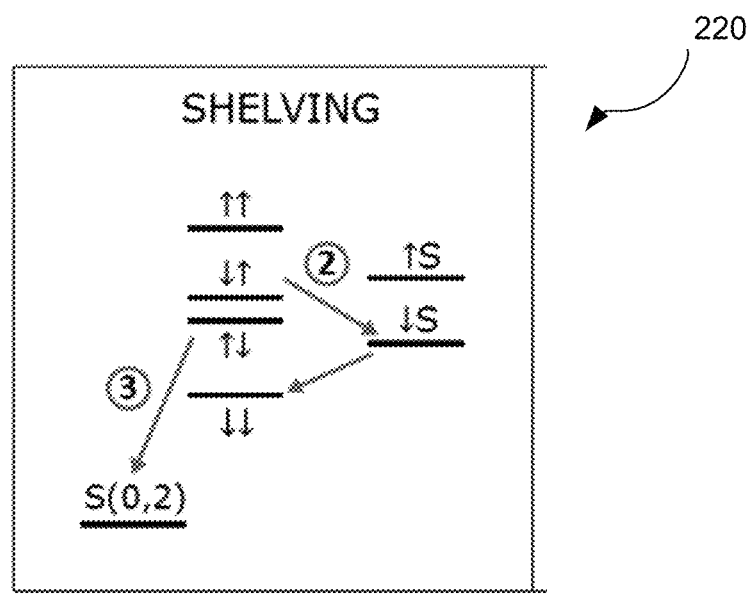
FIG. 2C is a schematic of the shelving readout procedure, with relevant state ladders and transitions indicated by arrows with numbers corresponding to those shown in FIG. 2B.

FIGS. 2B and 2C schematically illustrate the shelving method. In particular, FIG. 2B shows a charge stability diagram 210 with detuning between quantum dots, $\epsilon$, on the y-axis and the parameter $\gamma$ (indicating the potentials applied on one or more of the gate electrodes) controlling the total number of electrons in the system on the x-axis. There are three areas of the diagram—namely the charge configurations (1,1), (0,2) and (1,2). The arrows in the schematic represent the shelving readout protocol, with the circled numbers indicating the order of the readout steps. FIG. 2C shows a schematic 220 of the shelving process with relevant state ladders and transitions indicated by arrows with the numbers corresponding to FIG. 2B.

The shelving readout method maps the two-electron spin states $|\uparrow\downarrow\rangle$ and $|\downarrow\uparrow\rangle$ to different charge configurations, namely (0,2) and (1,1). In particular, the shelving protocol starts in the (1,1) charge configuration region. Further, the shelving protocol starts at high detuning $\epsilon$ where the exchange is negligible and $\Delta E_z$ sets the eigenstates to approximately:

$|G\rangle = |\uparrow\downarrow\rangle$ $|E\rangle = |\downarrow\uparrow\rangle$.

As referred to here, a high detuning refers to a detuning value where exchange J gets much smaller than Zeeman energy difference $\Delta E_z$ (as exchange depends on detuning while Zeeman energy difference is constant). The exact value of detuning depends on the specific values of Zeeman energy difference and how exchange depends on detuning and that the exchange detuning dependency is mainly impacted by tunnelling between the quantum dots $T_0$. Typically, if $\Delta E_z$ is hundreds of MHz and $T_0$ is of the order of 1 GHz, detuning would be tens-hundreds GHz.

The first step, step 1, is to ramp non-adiabatically along the $\gamma$-axis in a set time period, $t_{in}$, to, $\gamma_{max}$ 204 to the (1,2) charge configuration region and stay there for a second time period $t_{wait}$. The potentials created by control gates (e.g., gates 122, 124 and 126) are changing so that $\gamma$ is effectively ramped (from some initial $\gamma$ in (1,1) region to $\gamma_{max}$ in (1,2) region.

If $\gamma_{max}$ is set such that the energy level of the $|\downarrow S\rangle$ lies between the $|\downarrow\uparrow\rangle$ and the $|\downarrow\downarrow\rangle$ states) (see FIG. 2C), then the subsequent transition $|\downarrow\uparrow\rangle \rightarrow |\downarrow S\rangle \rightarrow |\downarrow\downarrow\rangle$ (indicated by the arrows denoted 2 in FIG. 2C) becomes available. Consequently, the $|\downarrow\uparrow\rangle$ state is mapped to the metastable triplet state $|T_-\rangle$.

The transition takes place due to the spin-down electron $|\downarrow\rangle$ tunnelling from the SET 132 to the right quantum dot 130 and the spin-up electron $|\uparrow\rangle$ tunnelling back to the SET 132. At the same time, the $|\uparrow\downarrow\rangle$ energy level does not undergo any transition as the $|\uparrow S\rangle$ state is energetically inaccessible and no electron can tunnel from the SET 132 to the right dot 130.

At step 2, the system is brought back to the (1,1) charge configuration region 202. Then by adiabatic change of detuning $\epsilon$, the system is moved to the Pauli-blocked region in the (0,2) charge configuration region at step 3. The potentials created by control gates (e.g., gates 122, 124 and 126) are changed such that $\gamma$ is effectively ramped from $\gamma_{max}$ in (1,2) region to some $\gamma$ in (1,1) region.

This is the Pauli-blocked region and is a part of (0,2) region between $\epsilon=0$ line and the dashed line 208 below it in FIG. 2B. In that region the singlet (0,2) is below the energy levels of (1,1) states, while the triplet (0,2) is above those states. As such, S(1,1) state can tunnel to S(0,2) and triplets cannot tunnel to any (0,2) charge configuration state. If the dashed line 208 is crossed (moving towards negative $\epsilon$) the triplet (0,2) energy level goes below all the (1,1) energy levels. Then the Pauli spin blockade doesn't work anymore, as triplets (including $|T_-\rangle$ and $|T_+\rangle$) can tunnel to (0,2) and cannot be distinguished from singlet anymore.

Figure 2D:
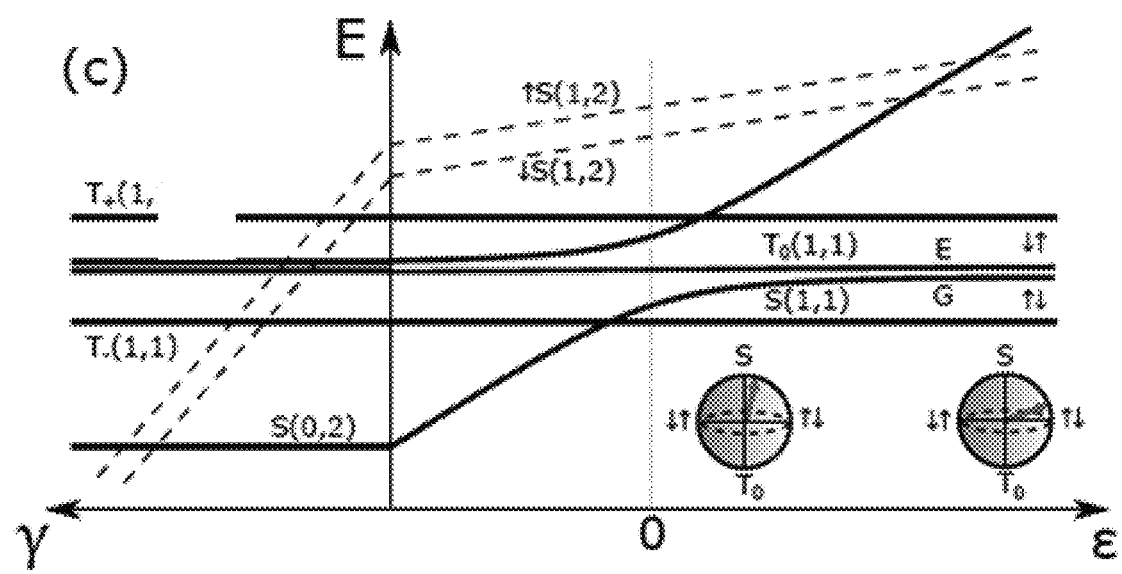
FIG. 2D shows a schematic energy representation of the energy levels of the charge states as a function of quantum dot detuning $\epsilon$ and global energy shift $\gamma$ for both quantum dots.

FIG. 2D shows a schematic representation of the energy levels (1,1), (0,2) and (1,2) configurations as a function of $\gamma$ (left part of the plot) and $\epsilon$ (on the right part of the plot). The seven system eigenstates are schematically depicted in FIG. 2D:

two (1,2) states, i.e., $|\downarrow S\rangle$ and $|\uparrow S\rangle$;
singlet S(0,2);
and four (1,1) states, i.e. spin-polarised $|T_-\rangle$ and $|T_+\rangle$, and the non-spin polarised $|G\rangle$ and $|E\rangle$ states (ground and excited states, respectively).

In the absence of a magnetic field gradient, $\Delta E_z=0$, the states $|G\rangle$ and $|E\rangle$ are split by the exchange interaction J and form singlet S(1,1) and triplet $T_0$(1, 1) states, respectively. $\Delta E_z$ mixes singlet and triplet states and in the limit of $\Delta E_z \gg J$ sets $|G\rangle = |\uparrow\downarrow\rangle$ and $|E\rangle = |\downarrow\uparrow\rangle$. Otherwise, the opposite states are set for $|G\rangle$ and $|E\rangle$ for $\Delta E_z<0$.

In an intermediate regime, where J and $\Delta E_z$ are comparable, the mixing of $|S\rangle$ and $|T_0\rangle$ (or $|\downarrow\uparrow\rangle$ and $|\uparrow\downarrow\rangle$) strongly depends on the relative amplitudes of exchange J and $\Delta E_z$. As the exchange J is controllable with the detuning $\epsilon$ between the S(1,1) and S(0,2) states, the singlet-triplet mixing can be modulated by the detuning $\epsilon$.

The shelving process causes $|\uparrow\downarrow\rangle$ to be mapped to the singlet (0,2) state—see FIG. 2C. While the $|\downarrow\uparrow\rangle$ state is mapped to the blocked triplet state $|T_-\rangle$—of charge configuration (1,1).

Due to the long relaxation time of the $|T_-\rangle$ state, the final (0,2) and (1,1) charge configurations can be measured with better visibilities compared to the standard PSBR method. The mapping obtained via the shelving procedure can be also conveniently used with dispersive readout, which can be performed using just a single gate and thus minimizes the device complexity.

In practice, even for large detuning $\epsilon$ the $|\downarrow\uparrow\rangle$ and $|\uparrow\downarrow\rangle$ states are mixed due to the non-zero exchange J. The admixtures of the opposite states cause leakage, lowering the total readout visibility. However, the shelved readout method solves the problem of fast relaxation due to singlet-triplet mixing, as the operation takes place in (1,1)-(1,2) region where the singlet (0,2) is energetically inaccessible.

In quantum dots using a micro-magnet, the magnetic field gradient, and thus $\Delta E_z$, can be deterministically set at the beginning of the measurements and kept constant throughout the experiment. However, there are also issues with accurately designing micro-magnets with the optimal magnetic field gradient. Further, these micro-magnets take up precious space on the physical chip.

In donor-based devices, however, $\Delta E_z$ originates from the different hyperfine interaction of the electron spins to each donor dot nuclei and is likely to change during the experiment. Due to the presence of nuclear spin flips, $\Delta E_z$ can change both value and sign which crucially can result in a reversed mapping of the $|G\rangle$ and $|E\rangle$ states.

Figure 3A:
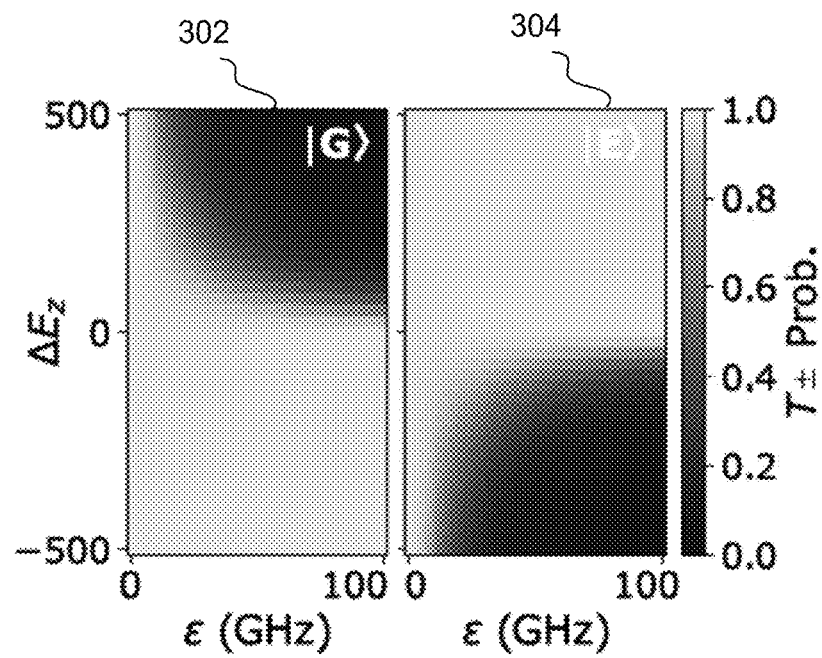
FIG. 3A shows the final probability of blocked triplet states $T_-$ and $T_+$ after shelving as a function of detuning $\epsilon$ on the x-axis and Zeeman energy difference $\Delta E_z$ on the y-axis.

FIG. 3A shows the final probability of blocked triplet states $|T_-\rangle$ and $|T_+\rangle$ after shelving as a function of detuning $\epsilon$ on the x-axis and Zeeman energy difference $\Delta E_z$ on the y-axis. Here $\gamma_{max}=0$. The left plot 302 corresponds to simulations starting from the ground state $|G\rangle$ and the right plot 304 corresponds to simulations starting from the excited state $|E\rangle$. Darker regions in both plots indicate lower probabilities of blocked triplet states and lighter regions in both plots indicate higher probability of block triplet states.

For the simulations shown in FIG. 3A the calculations are performed for the same change in $\gamma$, i.e., $\Delta\gamma$, with respect to the (1,1)/(1,2) transition line, i.e., black line between regions (1,1) and (1,2) in FIG. 2B. As such, for every detuning the simulation starts at 100 GHz to the left from (1,1)/(1,2) line and finishes exactly at the (1,1)/(1,2) transition line. Quantitatively we can say that we always start at $$\gamma_{init} = \frac{\epsilon}{2} - 100 \text{ GHz}$$

and finish $$\gamma_{max} = \frac{\epsilon}{2},$$

where $\gamma_{max}$ is set exactly at the (1,1)/(1,2) transition line for every detuning, i.e., black line between regions (1,1) and (1,2) in FIG. 2B. That result demonstrates the opposite readout mapping for positive and negative values of $\Delta E_z$. As explained above, for positive $\Delta E_z$ the excited qubit state $|E\rangle$ is mapped to $|T_-\rangle$ and eventually to the (1,1) charge configuration. While for negative values of $\Delta E_z$, the ground state $|G\rangle$ is mapped to $|T_-\rangle$.

Figure 3B:
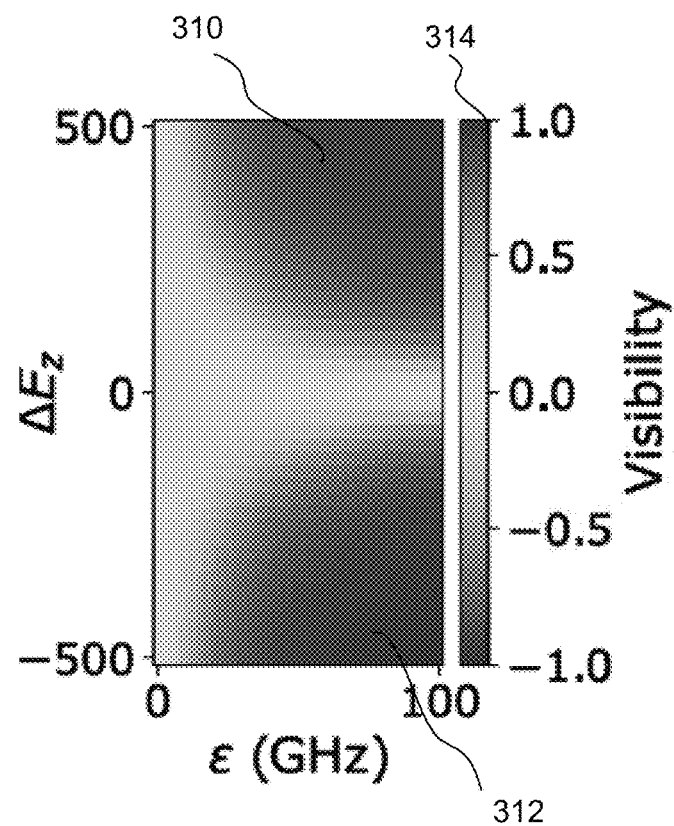
FIG. 3B shows the visibility of shelving readout as a function of the detuning $\epsilon$ on the x-axis and Zeeman energy difference $\Delta E_z$ on the y-axis.

FIG. 3B shows that visibility of shelving readout as a function of the detuning $\epsilon$ on the x-axis and Zeeman energy difference $\Delta E_z$ on the y-axis. The darker region 310 corresponds to values that result in higher visibility (between 0.5 and 1 on the visibility scale 314) and the darker region 312 corresponds to values that result in lower visibility (between −0.5 and −1.0 on the visibility scale 314). Finally, the lighter regions in the plot correspond to mid-range values on the visibility scale 314 (between −0.2-0.2, e.g.).

The visibility of the readout is calculated as $F_G+F_E-1$, where $F_G(F_E)$ is a final probability of charge configurations corresponding to $|G\rangle$ ($|E\rangle$) state when the initial state of the simulation has been set to $|G\rangle$ ($|E\rangle$). For shelving, F is calculated as a sum of final probabilities of $S_{02}$, $|G\rangle$ and $|E\rangle$ states $F_G=P_{S02}+P_G+P_E$, as we assume all of those states will be mapped to (0,2) charge configuration when we decrease detuning to Pauli blockaded (0,2) region and wait $T_0$ relaxation time. $F_E$ is calculated as a sum of blocked triplet states $T_-$ and $T_+$ probabilities.

As seen in FIG. 3B, the absolute value of the visibility increases with $|\Delta E_z|$, which is due to the smaller $|\downarrow\uparrow\rangle$ and $|\uparrow\downarrow\rangle$ states mixing and hence less leakage.

The visibility reaches 0 for $\Delta E_z=0$ because both the $|G\rangle$ and $|E\rangle$ states, now corresponding to singlet (1,1) and triplet states, respectively, can transfer to $|\downarrow S\rangle$ state equally fast. The visibility is also reduced for small detuning $\epsilon$, as in this region the exchange interaction dominates over $\Delta E_z$ (the x-axis limits $\epsilon=0$ and 100 GHz correspond to exchange J values of 2 GHz and 40 MHz, respectively).

A quasistatic nuclear polarization is assumed, which means that the nuclear spins are not flipping during single qubit operations and shelving readout. However, as the full experiment time usually reaches minutes or even hours, the nuclear spins will likely flip multiple times. In the system of two donor quantum dots we can express all possible values of $\Delta E_z$ as:

$$\Delta E_z = \sum_{j=1}^{N_R} A_R^j I_{R_z}^j - \sum_{i=1}^{N_L} A_L^i I_{L_z}^i$$

Where i and j enumerate nuclear spins in left and right dots 128, 130, with total donor numbers $N_L$, $N_R$, respectively. $A_L^i(A_R^j)$ is the hyperfine constant of the i-th (j-th) donor in the left (right) dots. $I_L^i(I_R^j)$ is the i-th left dot (j-th right dot) nuclear spin polarization in the z-direction and can take on values of ±1/2. The number of possible $\Delta E_z$ values therefore increase with the number of donors by $2^{N_L+N_R}$.

Figure 3C:
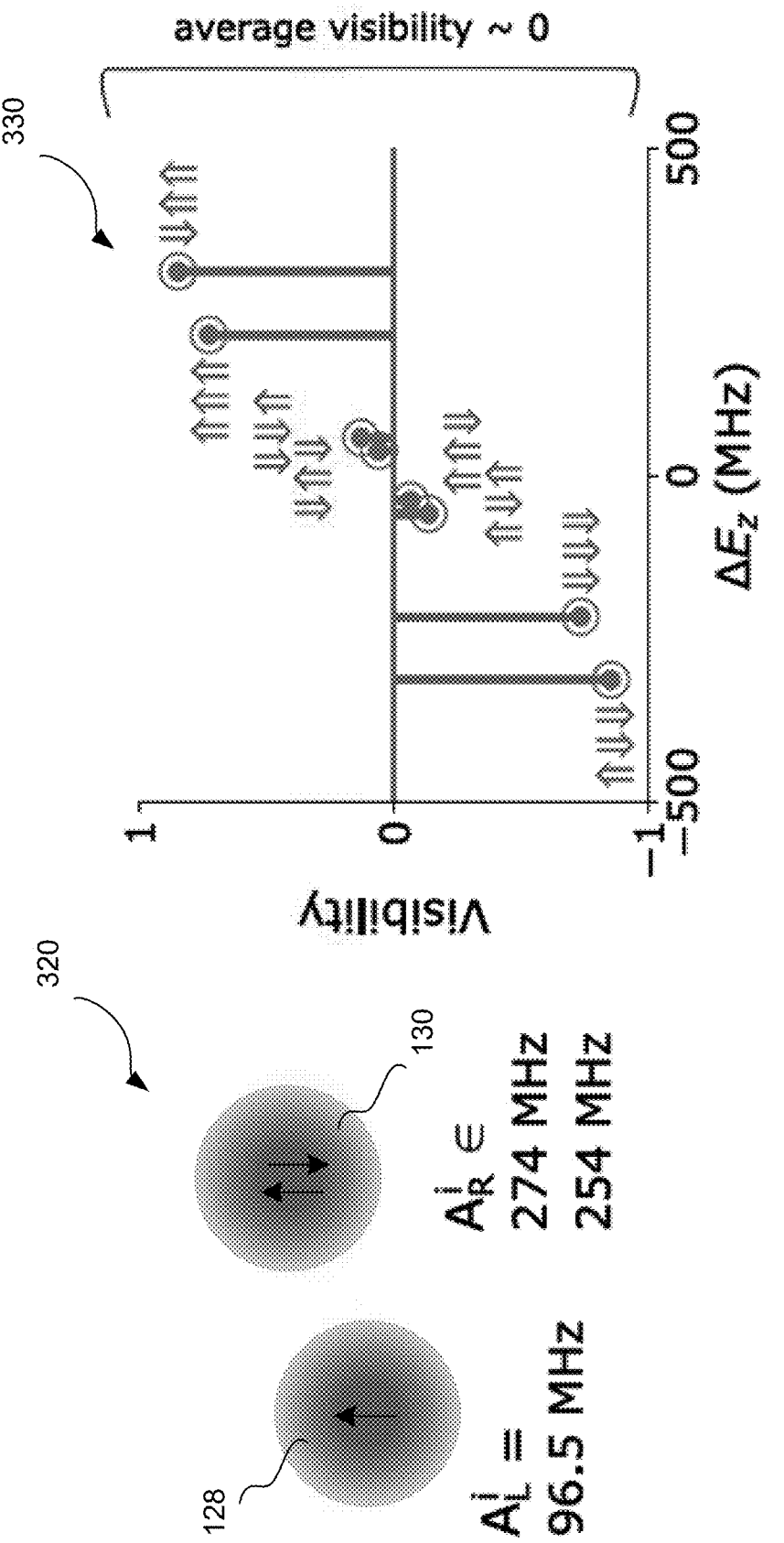
FIG. 3C shows the impact of the dynamic nuclear spins in an example of a 1P-2P system.

FIG. 3C schematically shows a 1P-2P system 320 with quantum dots 128, 130 and the impact of the dynamic nuclear spins in this example 1P-2P system with hyperfine constants $A_L$=96.5 MHz and $A_R^j \in$ [274, 254] MHz based on previously measured donor-based devices. The 1P-2P system 320 allows 8 different values of $\Delta E_z$ within the range between −312.25 and 312.25 MHz. The plot 330 on the right of FIG. 3C shows the visibility for all the possible nuclear spin configurations along the y axis and $\Delta E_z$ values along the x axis. The plot 330 also shows that after averaging over all the nuclear spin states the visibility goes to approximately zero. Although these results show one specific example of a multi-donor dots, the average zero visibility will be common to all quantum dots with multiple donors (with any values of hyperfine constants) due to the symmetry of the system. This is because for any nuclear configuration with a given $\Delta E_z$ it is possible to get the opposite value of $\Delta E_z$ just by flipping all the nuclear spins.

Additionally, the inventors of the present invention have found that even if nuclear polarization is changing slower than the total experiment time, it is important to know the sign of $\Delta E_z$ to ensure a proper mapping of $|G\rangle$ and $|E\rangle$ to (0,2) and (1,1) charge configurations. Knowing the sign of $\Delta E_z$ before a qubit operation means the overall readout visibility is increased.

To overcome the readout visibility issue with conventional shelving readout techniques and to determine the sign of $\Delta E_z$ to ensure a proper mapping of $|G\rangle$ and $|E\rangle$ to (0,2) and (1,1) charge configurations, aspects of the present disclosure provide an improved shelving readout method. In particular, the presently disclosed shelving readout method includes a calibration step that improves the total readout visibility.

The Calibration Step

Figures 4A, 4B:
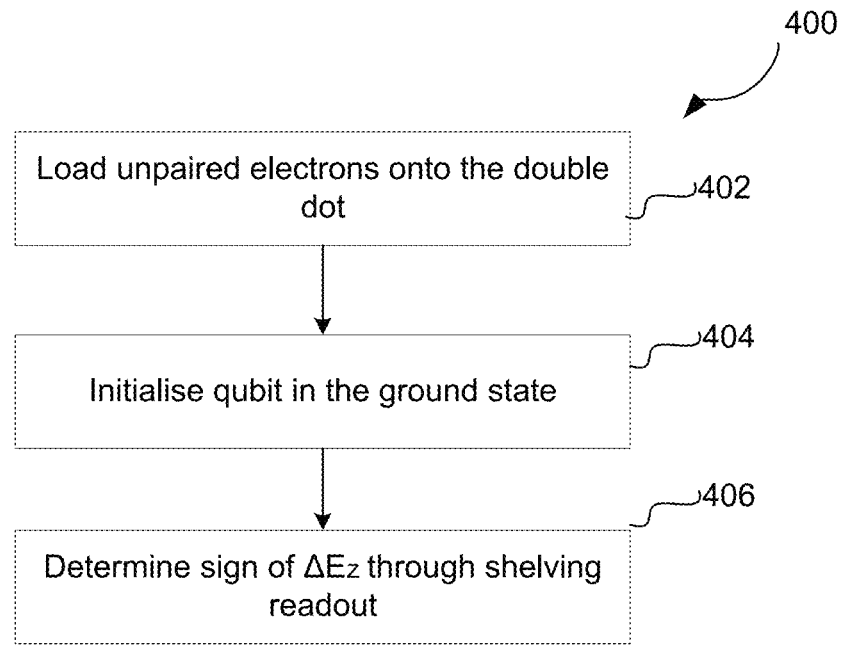
FIG. 4A is a flowchart showing an example method for shelving readout according to aspects of the present disclosure.
FIG. 4B is a flowchart showing an example shelving readout method for a singlet-triplet system.

FIG. 4A illustrates an example shelving method 400 including the calibration step according to aspects of the present disclosure.

First, at step 402, a double quantum dot system (e.g., the double quantum dot 100) is loaded with electrons (e.g., from the SET 132). In some examples, there is only one electron per quantum dot (e.g., 128, 130). In other examples there may be multiple electrons per quantum dot.

At step 404 the double quantum dot system 100 is initialised in the (1,1) ground state $|G\rangle$. This may be done by an adiabatic sweep from negative to positive detuning starting from the (0,2) state to (1,1) state.

At step 406, a shelving readout process (similar to that described above with respect to FIGS. 2B and 2C) is performed on the quantum dot system. Depending on the result of the shelving readout, the sign of $\Delta E_z$ can be determined. If the shelving readout is the (1,1) or (0,2) signal, then the ground state is predominately in the $|\downarrow\uparrow\rangle$ or $|\uparrow\downarrow\rangle$ state, respectively. Thus, the sign of $\Delta E_z$ can be determined. For example, if the final configuration measured after the shelving operation is (0, 2) then it can be determined that $\Delta E_z>0$. Alternatively, if the final configuration measured after the shelving operation is (1,1), then it can be determined that $\Delta E_z<0$.

Steps 402, 404 and 406 together form the calibrations step.

The calibration step is ideally performed before every qubit operation, to provide the correct mapping for the shelving readout of the qubit. However, it can be performed less frequently (every $i^{th}$ qubit operation) if the nuclear spin flips are significantly slower than the time of a single measurement.

Once the calibration steps 402, 404, 406 has been performed. The current sign of $\Delta E_z$ can be determined for use in subsequent shelving readout processes. The following qubit operation can use this information via a feed-forward protocol to map the final readout results.

FIG. 4B is a flowchart of an example method 410 that uses the calibration method 400 of FIG. 4A.

At step 412, the qubit or the double quantum dot system 100 is reinitialised in either the ground state or the excited state.

At step 414, a qubit operation is performed on the qubit. It will be appreciated that any qubit operation may be performed. For example, a rotation operation or a SWAP gate operation may be performed.

The qubit operation time needs to be faster than the time it takes for the nuclear spin polarisation to change. However, phosphorus donors in silicon have long nuclear spin coherence times—so the time required to perform the qubit operation is realistic. The longest coherence times for single phosphorus donors reach values of the order of seconds or even tens of seconds, while qubit operation for singlet-triplet qubits is less than a microsecond. The exact time scales required are also device dependent and may differ based on the number of donors and electrons in the systems.

For the system shown in FIG. 3C, the calibration method 400 increases the visibility from 0 to 44% for $\epsilon$=50 GHz, to 83% for $\epsilon$=200 GHz, and 99% for $\epsilon$=1000 GHz. In the limit of very high detuning only nuclear spin configurations with $\Delta E_z \approx 0$ would give zero visibility, harming the total efficiently of shelving readout. Those configurations can be avoided by fabricating multi-donor quantum dots with hyperfine constants which never add up to give $\Delta E_z$=0, such as $A_L^1 = A_R^1 = A_R^2$ for the 1P-2P system.

At step 416, shelving readout is performed with the current knowledge of the sign of $\Delta E_z$ such that the correct mapping is used. The obtained sign of $\Delta E_z$ can be used to apply the correct mapping for the subsequent qubit operation. That is, the qubit operation is performed (initialisation, control, shelving readout) and then it is mapped to the final measured charge configuration appropriately:

i) For charge state (0, 2): when $\Delta E_z$>0 mapped to singlet and for $\Delta E_z$<0 mapped to triplet;
ii) For charge state (1, 1): when $\Delta E_z$>0 mapped to triplet and for $\Delta E_z$<0 mapped to singlet.

Shelving readout solves the problem of triplet relaxation, as it maps one of the states to a metastable triplet T_ state in (1,1) charge configuration, and another state to (0,2) singlet. Therefore, it can significantly improve readout fidelity in comparison to PSBR.

However, for donor-based devices the magnetic field gradient (coming from the effective hyperfine interaction) is changing in time, as the nuclear spins tend to flip multiple times within the timescale of the experiment. The effective $\Delta E_z$ is thus uncontrollably changing both value and sign during the experiment. The interpretation of measured (1,1) and (0,2) charge configurations depend on the sign of $\Delta E_z$ (with opposite mappings for opposite signs). Thus, without knowledge about the current nuclear spin state, the average visibility of the readout over time (or over all the nuclear configurations) will reach 0%.

The calibration step described herein provides information about the current sign of $\Delta E_z$, allowing to employ correct shelving readout mapping for every single qubit operation. This procedure allows the efficient use of shelving readout for singlet-triplet qubits in donor-based devices, even if the effective $\Delta E_z$ uncontrollably changes in time.

The term "comprising" (and its grammatical variations) as used herein are used in the inclusive sense of "having" or "including" and not in the sense of "consisting only of".

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

The invention claimed is:

1. A method for readout of a singlet-triplet qubit in a donor based quantum processing element, the method comprising the steps of:
   initialising the singlet-triplet qubit in a ground state $|G\rangle$;
   performing a shelving readout;
   using a final measured charge configuration of the singlet-triplet qubit to determine information about a current Zeeman energy difference, wherein the determined information about the current Zeeman energy difference is the sign of the Zeeman energy difference; and
   using the information about the current Zeeman energy difference to adjust mapping of the shelving readout.

2. The method of claim 1, wherein the donor based quantum processing element comprises:
   a semiconductor substrate,
   a dielectric material forming an interface with the semiconductor substrate,
   one or more gate electrodes, and
   a double quantum dot system comprising two dopant dots embedded in the semiconductor substrate, each dopant dot comprising one or more dopant atoms and two or more electrons or holes confined in the double dot system.

3. The method of claim 2, wherein the spin of the two or more electrons or holes are entangled to form a singlet state and three triplet states.

4. The method of claim 3, wherein a singlet-triplet qubit is encoded in the $|S\rangle$ singlet state and a $|T_0\rangle$ triplet state.

5. The method of claim 2, wherein performing the shelving readout comprises: mapping the spin state $|\uparrow\downarrow\rangle$ and $|\uparrow\downarrow\rangle$ of two or the two or more electrons or holes to charge configurations (0,2) and (1,1), respectively.

6. The method of claim 2, wherein performing the shelving readout comprises:
   starting the singlet-triplet qubit in a (1,1) charge configuration;
   moving the singlet-triplet qubit from the (1, 1) configuration to a (1,2) charge configuration by applying potentials to the one or more gate electrodes;
   moving the singlet-triplet qubit back to the (1,1) charge configuration by applying potentials to the one or more gate electrodes; and
   adiabatically changing a detuning to move the singlet-triplet qubit to a (0,2) charge configuration.

7. The method of claim 2, wherein the two or more electrons or holes are loaded on to the dopant dots via at least one gate electrode of the one or more gate electrodes.

8. The method of claim 2, wherein the dopant atoms are phosphorus atoms.

9. The method of claim 2, wherein the semiconductor substrate is silicon and the dielectric is silicon dioxide.

10. The method of claim 2, wherein the semiconductor substrate is isotopically purified silicon-28 and the dielectric is silicon dioxide.

11. The method of claim 2, wherein the gate of the one or more gate electrodes are manufactured within the semiconductor substrate to control the donor dots.

12. The method of claim 1, further comprising performing a qubit operation.

13. The method of claim 12, further comprising:
   performing a second shelving readout; and
   applying the information about the current Zeeman energy difference to adjust mapping of the second shelving readout.

* * * * *